United States Patent
Shimada et al.

(10) Patent No.: US 7,910,027 B2
(45) Date of Patent: *Mar. 22, 2011

(54) SEMICONDUCTOR CERAMIC COMPOSITION AND METHOD FOR PRODUCING THE SAME

(75) Inventors: Takeshi Shimada, Saitama (JP); Kazuya Toji, Osaka (JP)

(73) Assignee: Hitachi Metals, Ltd., Tokyo (JP)

( * ) Notice: Subject to any disclaimer, the term of this patent is extended or adjusted under 35 U.S.C. 154(b) by 145 days.

This patent is subject to a terminal disclaimer.

(21) Appl. No.: 12/281,896

(22) PCT Filed: Oct. 26, 2007

(86) PCT No.: PCT/JP2007/070959
§ 371 (c)(1),
(2), (4) Date: Sep. 5, 2008

(87) PCT Pub. No.: WO2008/050876
PCT Pub. Date: May 2, 2008

(65) Prior Publication Data
US 2009/0057626 A1    Mar. 5, 2009

(30) Foreign Application Priority Data

Oct. 27, 2006  (JP) .................... 2006-293366
Nov. 1, 2006   (JP) .................... 2006-298305

(51) Int. Cl.
*H01B 1/08*  (2006.01)
(52) U.S. Cl. .................... 252/520.21; 423/598
(58) Field of Classification Search ............. 252/520.21; 423/598; 501/137–139; 338/22 SD
See application file for complete search history.

(56) References Cited

U.S. PATENT DOCUMENTS

| | | | |
|---|---|---|---|
| 7,090,785 B2 * | 8/2006 | Chiang et al. | 252/62.9 R |
| 7,700,509 B2 * | 4/2010 | Shimada et al. | 501/137 |
| 7,704,906 B2 * | 4/2010 | Shimada et al. | 501/137 |
| 2009/0105064 A1 * | 4/2009 | Shimada et al. | 501/138 |
| 2010/0012905 A1 * | 1/2010 | Shimada et al. | 252/520.21 |
| 2010/0075824 A1 * | 3/2010 | Shimada | 501/123 |

FOREIGN PATENT DOCUMENTS

| | | |
|---|---|---|
| JP | 56-169301 | 12/1981 |
| JP | 2006-179692 | 7/2006 |
| WO | WO 2006/106910 A1 | 10/2006 |
| WO | WO2006/118274 | * 11/2006 |

OTHER PUBLICATIONS

Huo et al "Effects of Bi1/2Na1/2TiO3 on the Curie temperature and the PTC effects of BaTiO3-based positive temperature coefficient ceramics", Sensors and Actuators A 128 (2006) 265-69.*

* cited by examiner

Primary Examiner — Mark Kopec
(74) Attorney, Agent, or Firm — Stein McEwen, LLP

(57) ABSTRACT

It is intended to provide a semiconductor ceramic composition capable of shifting the Curie temperature to a positive direction as well as of obtaining an excellent jump characteristic while suppressing an increase in room temperature resistivity to a minimum value. There is provided a semiconductor ceramic composition in which a portion of Ba of $BaTiO_3$ is substituted by Bi—Na, the semiconductor ceramic composition being obtained by sintering a mixed calcined powder of a BT calcined powder containing $(BaR)TiO_3$ or $Ba(TiM)O_3$ (wherein each of R and M is a semiconductive dopant), wherein a part of $BaCO_3$ and $TiO_2$ are remained therein; and a BNT calcined powder containing a $(BiNa)TiO_3$ powder.

8 Claims, 1 Drawing Sheet

SEMICONDUCTOR CERAMIC COMPOSITION AND METHOD FOR PRODUCING THE SAME

CROSS-REFERENCE TO RELATED APPLICATIONS

This application claims the benefit of PCT International Patent Application No. PCT/JP2007/070959, filed Oct. 26, 2007, and Japanese Patent Application Nos. 2006-293366 and 2006-298305, filed Oct. 27, 2006 and Nov. 1, 2006, respectively, in the Japanese Patent Office, the disclosures of which are incorporated herein by reference.

BACKGROUND OF THE INVENTION

1. Field of the Invention

This invention relates to a semiconductor ceramic composition having a positive temperature coefficient of resistivity, which is used for a PTC thermistor, a PTC heater, a PTC switch, a temperature detector, and the like.

2. Description of the Related Art

Conventionally, as materials showing a PTCR characteristic (Positive Temperature Coefficient of Resistivity), there have been proposed compositions in which various semiconductive dopants are added to BaTiO3. These compositions have Curie temperatures around 120° C. Depending on the use, these compositions need to be shifted in the Curie temperatures.

For example, it has been proposed to shift the Curie temperature by adding SrTiO3 to BaTiO3; however, the Curie temperature is shifted only in a negative direction and is not shifted in a positive direction in this case. Currently, only PbTiO3 is known as an adding element for shifting the Curie temperature in a positive direction. However, since PbTiO3 includes an element that causes environmental pollution, a material which does not use PbTiO3 has been in demand in recent years.

In the BaTiO3 semiconductor porcelain, with an object of preventing a reduction in temperature coefficient of resistivity by Pb substitution as well as promoting productivity or reliability by reducing a voltage dependency, there has been proposed a method of producing a BaTiO3 semiconductor porcelain in which one or more kinds of Nb, Ta, and a rare earth element is added to a composition obtained by using no PbTiO3 and controlling x to a range of $0 < x \leq 0.15$ in a structure of Ba1−2x(BiNa)xTiO3 that is achieved by substituting a portion of Ba of BaTiO3 by Bi—Na; followed by sintering the composition in nitrogen; and thereafter subjecting the composition to a heat treatment in an oxidation atmosphere (see Patent Reference 1).

Patent Reference 1: JP-A-56-169301

SUMMARY OF THE INVENTION

One of the great features of the PTC materials is the sharp increase in resistivity at the Curie point (jump characteristic=temperature coefficient of resistivity α), and this is considered to be caused due to an increase in resistivity formed at a crystal grain boundary (resistivity by shot key barrier). As to a property of the PTC materials, a PTC material having a high jump characteristic in resistivity is in demand.

In Patent Reference 1, although a composition obtained by adding 0.1 mol % of $Nd_2O_3$ as a semiconductive dopant is disclosed as one of Examples, when a trivalent positive ion is added as the semiconductive dopant in the case of performing atomic valence control of the composition, the effect of semiconductor formation is deteriorated due to the presence of a monovalent Na ion. Therefore, a problem of an increase in resistivity at a room temperature is raised.

As described above, among the PTC materials containing no Pb such as that disclosed in Patent Reference 1, those excellent in jump characteristic tends to have high room temperature resistivity, while those inferior in jump characteristic tends to have low room temperature resistivity, thereby posing a problem that it is difficult to achieve both of stable room temperature resistivity and excellent jump characteristic. Also, those inferior in jump characteristic have problems that a temperature fluctuation near the Curie temperature is increased and a stabilized temperature tends to be higher than the Curie temperature.

In order to suppress the fluctuation in stabilized temperature as well as to enable easy material designing, it is necessary to improve the jump characteristic. A little increase in room temperature resistivity is considered to be effective for the jump characteristic improvement, but it is considerably difficult to maintain a high jump characteristic and suppress an increase in room temperature resistivity at the same time, and it was usually the case that the room temperature resistivity is increased too much to be maintained within a usable range.

Also, Patent Reference 1 discloses as one of Examples that all of elements constituting a composition such as $BaCO_3$, $TiO_3$, $Bi_2O_3$, $Na_2O_3$, and PbO used as start materials are mixed before calcination to subsequently perform calcination, forming, sintering, and a heat treatment. However, in a composition in which a portion of Ba of $BaTiO_3$ is substituted by Bi—Na, when all of elements constituting the composition are mixed before calcination, Bi is evaporated in a calcination step to cause a composition shift in Bi—Na, whereby generation of a secondary phase is promoted to raise problems of an increase in resistivity at a room temperature and a fluctuation in Curie temperature.

It may be considered to perform calcination at a lower temperature may for suppressing Bi evaporation. However, while the Bi evaporation may be suppressed by the calcination, it has problems of being incapable of forming a perfect solid solution and failing to obtain desired characteristics.

An object of the invention is to provide a semiconductor ceramic composition containing no Pb, which is capable of shifting the Curie temperate to a positive direction as well as of controlling room temperature resistivity and having an excellent jump characteristic.

Further, it is another object of the invention to provide a semiconductor porcelain composition in which a portion of Ba of $BaTiO_3$ is substituted by Bi—Na, which is capable of inhibiting evaporation of Bi in a calcining step, inhibiting the formation of secondary phases by preventing a compositional shift of Bi—Na, further reducing a resistivity at room temperature, and inhibiting a fluctuation in a Curie temperature, and a method of producing the same.

As a result of intensive studies for attaining the above-described objects, the inventors found that, in a production of a semiconductor ceramic composition in which a portion of Ba of $BaTiO_3$ is substituted by Bi—Na, when a $(BaR)TiO_3$ calcined powder or $Ba(TiM)O_3$ calcined powder (hereinafter referred to as "BT calcined powder") and a $(BiNa)TiO_3$ powder (hereinafter referred to as "BNT calcined powder") are separately prepared and each of the BT calcined powder and the BNT calcined powder is calcined at an appropriate temperature therefor, it is possible to suppress Bi evaporation in the BNT calcined powder as well as to suppress generation of a secondary phase through prevention of a Bi—Na compositional shift, and it is possible to obtain a semiconductor ceramic composition having low resistivity at a room temperature and suppressed in fluctuation in Curie temperature by mixing, forming, and sintering the calcined powders.

Further, the inventors found that an amount of shot key barrier formation is increased by preparing the BT calcined powder in such a manner that a part of $BaCO_3$ and $TiO_2$ are remained in the calcined powder and then mixing the BT calcined powder and the BNT calcined powder followed by sintering, and that a jump characteristic is improved along with the increase in shot key barrier formation amount while suppressing an increase in room temperature resistivity to a minimum value, thereby accomplishing the invention.

The invention provides a semiconductor ceramic composition in which a portion of Ba of $BaTiO_3$ is substituted by Bi—Na, the semiconductor ceramic composition being obtained by sintering a mixed calcined powder of a BT calcined powder comprising $(BaR)TiO_3$ or $Ba(TiM)O_3$ (wherein each of R and M is a semiconductive dopant), wherein a part of $BaCO_3$ and $TiO_2$ are remained therein; and a BNT calcined powder comprising a $(BiNa)TiO_3$ powder.

The invention proposes, in the semiconductor ceramic composition having the above-described structure, a structure wherein, in the BT calcined powder, the content of $BaCO_3$ is 30 mol % or less and the content of $TiO_2$ is 30 mol % or less when a total amount of $(BaR)TiO_3$ or $Ba(TiM)O_3$, $BaCO_3$, and $TiO_2$ is taken as 100 mol %;

a structure wherein when the semiconductive dopant R is at least one member of rare earth elements and the $(BaR)TiO_3$ calcined powder is used as the BT calcined powder, the semiconductor ceramic composition is represented by a composition formula of $[(BiNa)_x(Ba_{1-y}R_y)_{1-x}]TiO_3$ in which x and y each satisfy $0<x\leq0.3$ and $0<y\leq0.02$;

a structure wherein when the semiconductive dopant M is at least one member of Nb and Sb and the $Ba(TiM)O_3$ calcined powder is used as the BT calcined powder, the semiconductor ceramic composition is represented by a composition formula of $[(BiNa)_xBa_{1-x}][Ti_{1-z}M_z]O_3$ in which x and z each satisfy $0<x\leq0.3$ and $0<z\leq0.005$.

Furthermore, the invention proposes a method for producing a semiconductor ceramic composition in which a portion of Ba of $BaTiO_3$ is substituted by Bi—Na, the method comprising steps of:

preparing a BT calcined powder comprising $(BaR)TiO_3$ or $Ba(TiM)O_3$ (wherein each of R and M is a semiconductive dopant), wherein a part of $BaCO_3$ and $TiO_2$ are remained therein;

preparing a BNT calcined powder comprising a (BiNa)$TiO_3$ powder;

preparing a mixed calcined powder by mixing the BT calcined powder and the BNT calcined powder; and forming and sintering said mixed calcined powder.

The invention proposes, in the method for producing a semiconductor ceramic composition having the above-described structure, a structure wherein a calcination temperature is 900° C. or less in the step of preparing the BT calcined powder;

a structure wherein a calcination temperature is 700° C. to 950° C. in the step of preparing the BNT calcined powder;

a structure wherein, in the BT calcined powder, the content of $BaCO_3$ is 30 mol % or less and the content of $TiO_2$ is 30 mol % or less when a total amount of $(BaR)TiO_3$ or $Ba(TiM)O_3$, $BaCO_3$, and $TiO_2$ is taken as 100 mol %;

a structure wherein 3.0 mol % or less of Si oxide and 4.0 mol % or less of Ca carbonate or Ca oxide are added before the calcination in the step of preparing the BT calcined powder or the step of preparing the BNT calcined powder or in both of the steps;

a structure wherein 3.0 mol % or less of Si oxide and 4.0 mol % or less of Ca carbonate or Ca oxide are added in the step of preparing the mixed calcined powder by mixing the BT calcined powder and the BNT calcined powder;

a structure wherein when the semiconductive dopant R is at least one member of rare earth elements and the $(BaR)TiO_3$ calcined powder is used as the BT calcined powder, the semiconductor ceramic composition is represented by a composition formula of $[(BiNa)_x(Ba_{1-y}R_y)_{1-x}]TiO_3$ in which x and y each satisfy $0<x\leq0.3$ and $0<y\leq0.02$; and a structure wherein when the semiconductive dopant M is at least one member of Nb and Sb and the $Ba(TiM)O_3$ calcined powder is used as the BT calcined powder, the semiconductor ceramic composition is represented by a composition formula of $[(BiNa)_xBa_{1-x}][Ti_{1-z}M_z]O_3$ in which x and z each satisfy $0<x\leq0.3$ and $0<z\leq0.005$.

According to the invention, it is possible to provide a semiconductor ceramic composition that does not contain Pb and is capable of shifting the Curie temperature to a positive direction as well as of achieving a high jump characteristic while suppressing an increase in room temperature resistivity to a minimum value.

Also, according to the invention, it is possible to provide a semiconductor ceramic composition that is: suppressed in evaporation of Bi in a calcination step; suppressed in generation of a secondary phase by preventing a compositional shift of Bi—Na; further reduced in resistivity at a room temperature; and suppressed in fluctuation in Curie temperature.

DETAILED DESCRIPTION OF THE EMBODIMENTS

Figure 1:
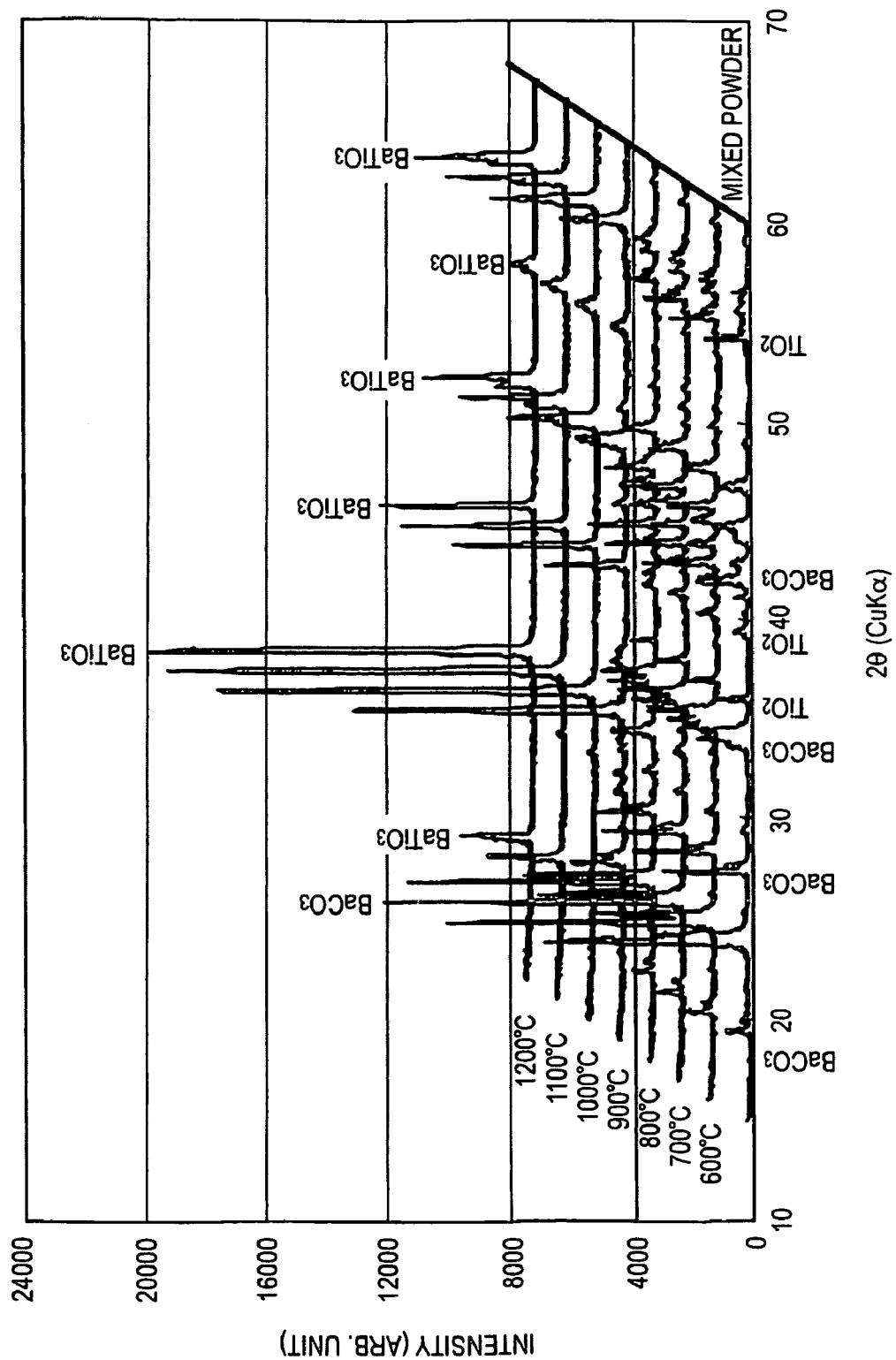
FIG. 1 is a diagram showing X-ray diffraction patterns of calcination temperatures of $(BaLa)TiO_3$ calcined powders according to the invention.

A semiconductor ceramic composition of the invention is obtained by sintering a mixed calcined powder of a BT calcined powder containing $(BaR)TiO_3$ or $Ba(TiM)O_3$ (in which each of R and M is a semiconductive dopant), in which a part of $BaCO_3$ and $TiO_2$ are remained therein; and a BNT calcined powder containing a $(BiNa)TiO_3$ powder.

According to the invention, although it is possible to use any compositions that include the composition in which a portion of Ba of $BaTiO_3$ is substituted by Bi—Na as the semiconductor ceramic composition, it is possible to increase the Curie temperature without using Pb as well as to achieve a high jump characteristic while suppressing an increase in room temperature resistivity to a minimum value when x and y in a composition formula of $[(BiNa)_x(Ba_{1-y}R_y)_{1-x}]TiO_3$ (wherein R is at least one member of rare earth elements) each satisfy $0<x\leq0.3$ and $0<y\leq0.02$, or x and z in a composition formula of $[(BiNa)_xBa_{1-x}][Ti_{1-z}M_z]O_3$ (wherein M is at least one member of Nb and Sb) each satisfy $0<x\leq0.3$ and $0<z\leq0.005$.

In the composition represented by $[(BiNa)_x(Ba_{1-y}R_y)_{1-x}]TiO_3$, x represents a range of component of (BiNa), and a preferred range thereof is $0<x\leq0.3$. It is impossible to shift the Curie temperature to the high temperature side when x is 0, and room temperature resistivity undesirably approaches to $10^4$ Ωcm when x exceeds 0.3 to make it difficult to apply the composition to a PTC heater and the like.

R is at least one member of rare earth elements, and La is most preferred. In the composition formula, y represents a range of component of R, and a preferred range thereof is $0 < y \leq 0.02$. The composition is not formed into a semiconductor when y is 0, and room temperature resistivity becomes undesirably large when y exceeds 0.02. Atomic valence control is performed by changing the value of y, but, in the case of performing atomic valence control of a composition in a system wherein a portion of Ba is substituted by Bi—Na, there is a problem that the effect of forming semiconductor is deteriorated due to the presence of a monovalent Na ion when a trivalent positive ion is added as a semiconductive dopant, thereby increasing room temperature resistivity. Therefore, a more preferred range thereof is $0.002 \leq y \leq 0.02$. The range $0.002 \leq y \leq 0.02$ is 0.2 mol % to 2.0 mol % in terms of mol %. In Patent Reference 1 mentioned above, although 0.1 mol % of $Nd_2O_3$ is added as a semiconductor element, it is considered that semiconductor formation sufficient for use in PTC is not realized in that case.

In the composition represented by $[(BiNa)_xBa_{1-x}][Ti_{1-z}M_z]O_3$, x represents a range of component of (BiNa), and a preferred range thereof is $0 < x \leq 0.3$. It is impossible to shift the Curie temperature to the high temperature side when x is 0, and room temperature resistivity undesirably approaches to $10^4$ Ωcm when x exceeds 0.3 to make it difficult to apply the composition to a PTC heater and the like.

M is at least one member of Nb and Sb, wherein Nb is preferred. In the composition formula, z represents a range of component of M, and a preferred range thereof is $0 < z \leq 0.005$. It is impossible to form the composition into a semiconductor due to a failure in atomic valence control when z is 0, and room temperature resistivity undesirably exceeds $10^3$ Ωcm when z exceeds 0.05. The range $0 < z \leq 0.005$ is 0 to 0.5 mol % (excluding 0) in terms of mol %.

In the case of the composition represented by $[(BiNa)_xBa_{1-x}][Ti_{1-z}M_z]O_3$, Ti is substituted by M element in order to perform the atomic valence control, and, since the addition of M element (addition amount: $0 < z \leq 0.005$) is targeted on the atomic valence control of a Ti site which is a tetravalent element, it is possible to perform the atomic valence control with the use of R element in an amount less than the preferred addition amount ($0.002 \leq y \leq 0.02$) in the composition represented by $[(BiNa)_xBa_{1-y}R_y)_{1-x}]TiO_3$ wherein R is used as the semiconductive dopant. Thus, the composition represented by $[(BiNa)_xBa_{1-x}][Ti_{1-z}M_z]O_3$ has the advantage of alleviating internal distortion of the semiconductor ceramic composition according to the invention.

In both of the composition represented by $[(BiNa)_xBa_{1-y}R_y)_{1-x}]TiO_3$ and the composition represented by $[(BiNa)_xBa_{1-x}][Ti_{1-z}M_z]O_3$, the ratio between Bi and Na is basically 1/1. As a composition formula, the ratio is expressed as $[(Bi_{0.5}Na_{0.5})_x(Ba_{1-y}R_y)_{1-x}]TiO_3$ and $[(Bi_{0.5}Na_{0.5})_xBa_{1-x}][Ti_{1-z}M_z]O_3$. The ratio between Bi and Na in each of the compositions is basically set to 1/1 since the ratio between Bi and Na can be fluctuated due to evaporation of Bi in a calcination step, for example. That is to say, a case in which the ratio between Bi and Na in preparation is 1/1 but deviates from 1/1 in a sintered material is also included in the invention.

Hereinafter, one example of the production method for obtaining the semiconductor ceramic composition according to the invention will be described.

In the invention, in a production of the semiconductor ceramic composition in which a portion of Ba of $BaTiO_3$ is substituted by Bi—Na, a method including separately preparing a BT calcined powder containing a $(BaR)TiO_3$ powder or a $Ba(TiM)O_3$ powder and a BNT calcined powder containing a $(BiNa)TiO_3$ powder; followed by calcining each of the BT calcined powder and the BNT calcined powder at an appropriate temperature therefor (hereinafter referred to as separate calcination method) is employed.

By employing the above-described separate calcination method, Bi evaporation from the BNT calcined powder is suppressed, and it is possible to suppress generation of a secondary phase through prevention of a compositional shift of Bi—Na. Therefore, it is possible to obtain a semiconductor ceramic composition reduced in resistivity at a room temperature and suppressed in fluctuation in Curie temperature by mixing, forming, and sintering the calcined powders.

In the separate calcination method, the BT calcined powder is prepared by mixing $BaCO_3$, $TiO_2$, and a raw material powder of a semiconductive dopant such as $La_2O_3$ and $Nb_2O_5$ to prepare the mixed raw material powder, followed by sintering, and a sintering temperature has heretofore been set within the range of 900° C. to 1300° C. for the purpose of forming a perfect single phase. According to the invention, when the calcination is performed at a calcination temperature of 900° C. or less that is lower than ever before, it is possible not to form $(BaR)TiO_3$ or $Ba(TiM)O_3$ perfectly to thereby remain a part of $BaCO_3$ and $TiO_2$ in the calcined powder.

In the above-described method, $(BaR)TiO_3$ or $Ba(TiM)O_3$ is formed too much when the calcining temperature exceeds 900° C., thereby undesirably inhibiting $BaCO_3$ and $TiO_2$ from being remained. The calcining time may preferably be 0.5 to 10 hours, more preferably 2 to 6 hours.

In the invention, in the case of preparing the BT calcined powder by employing the separate calcination method as described above, it is important to remain a part of $BaCO_3$ and $TiO_2$ in the calcined powder. Owing to such a constitution, the semiconductor ceramic composition in which a portion of Ba of $BaTiO_3$ is substituted by Bi—Na to be ultimately obtained is increased in amount of shot key barrier formation, and, along with the increase in shot key barrier formation amount, a jump characteristic is improved while suppressing an increase in room temperature resistivity to a minimum value.

When the BT calcined powder containing $(BaR)TiO_3$ or $Ba(TiM)O_3$, in which a part of $BaCO_3$ and $TiO_2$ are remained therein, is mixed together with the BNT calcined powder containing a $(BiNa)TiO_3$ powder, which is prepared separately therefrom, and then the mixed calcined powder is formed and sintered, it is possible to obtain the semiconductor ceramic composition in which a portion of Ba of $BaTiO_3$ is substituted by Bi—Na.

In the BT calcined powder, when a total of $(BaR)TiO_3$ or $Ba(TiM)O_3$, $BaCO_3$, and $TiO_2$ is taken as 100 mol %, the content of $BaCO_3$ may preferably be 30 mol % or less, and the content of $TiO_2$ may preferably be 30 mol % or less. It is possible to adjust the room temperature resistivity and the jump characteristic by changing these contents.

In order to change the contents of $BaCO_3$ and $TiO_2$ in the BT calcined powder, the calcining temperature may be changed without exceeding 900° C., the calcining time may be changed, or the composition of the BT calcined powder may be changed in the step of preparing the BT calcined powder. Furthermore, it is also possible to change the contents of $BaCO_3$ and $TiO_2$ in the BT calcined powder, for example, by adding the BNT calcined powder in which a perfect single phase is formed by calcining at a temperature exceeding 900° C. or by adding a $BaCO_3$ powder and a $TiO_2$ powder to the BT calcined powder, BNT calcined powder or the mixed culcined powder thereof.

The content of $BaCO_3$ is set to 30 mol % or less since a secondary phase other than $BaCO_3$ is generated when the content exceeds 30 mol % to increase the room temperature resistivity. Also, a $CO_2$ gas is generated during the sintering step to undesirably cause a crack on a sintered material. The content of $TiO_2$ is set to 30 mol % or less since a secondary phase other than $BaCO_3$ is generated when the content exceeds 30 mol % to increase the room temperature resistivity.

An upper limit of the total content of $BaCO_3$ and $TiO_2$ is 60 mol % (30 mol % of $BaCO_3$ and 30 mol % of $TiO_2$), and a lower limit thereof is a value exceeding 0; however, in the case where the content of $BaCO_3$ exceeds 20 mol %, a secondary phase other than $BaCO_3$ is generated when the content of $TiO_2$ is less than 10 mol % to undesirably raise the room temperature resistivity. The case wherein the content of $TiO_2$ exceeds 20 mol % and the content of $BaCO_3$ is less than 10 mol % is also undesirable for the same reason. Therefore, in the case where one of the contents of $BaCO_3$ and $TiO_2$ exceeds 20 mol %, it is preferable to adjust the calcination temperature, the calcining time, the composition and the like so as to maintain the other one to 10 mol % or more.

In a step of preparing the BNT calcined powder containing a $(BiNa)TiO_3$ calcined powder, which is to be mixed with the BT calcined powder in which a part of $BaCO_3$ and $TiO_2$ are remained, a mixed raw material powder is firstly prepared by mixing raw material powders of $Na_2CO_3$, $Bi_2O_3$, and $TiO_2$. When an excessive amount (exceeding 5 mol %, for example) of $Bi_2O_3$ is added, a secondary phase is generated during the calcination, thereby undesirably increasing the room temperature resistivity.

Subsequently, the mixed raw material powder is calcined. A calcination temperature may preferably be within the range of 700° C. to 950° C. A calcining time may preferably be 0.5 to 10 hours, more preferably 2 to 6 hours. When the calcination temperature is less than 700° C. or the calcining time is less than 0.5 hour, a non-reacted $Na_2CO_3$ or NaO generated by decomposition reacts with an ambient moisture or a solvent in the case of wet mixing, thereby undesirably causing a compositional shift or a variation in characteristics. Also, when the calcination temperature exceeds 950° C. or the calcining time exceeds 10 hours, Bi evaporation is progressed to cause the compositional shift, thereby undesirably promoting generation of a secondary phase.

By preparing the BT calcined powder and the BNT calcined powder separately by the separate calcination method, it is possible to calcine the BNT calcined powder at a relatively low temperature, whereby it is possible to provide the semiconductor ceramic composition that is: suppressed in Bi evaporation; suppressed in generation of secondary phase containing Na through prevention of compositional shift of Bi—Na; further reduced in resistivity at room temperature; and suppressed in fluctuation in Curie temperature.

In each of the steps for preparing the calcined powders, crushing may be performed when mixing the raw material powders depending on a grain size of the raw material powders. Also, the mixing and crushing may be either one of wet mixing/crushing using a pure water or ethanol or dry mixing/crushing, but the dry mixing/crushing is preferred since it is possible to more reliably prevent the compositional shift by the dry mixing/crushing. Although $BaCO_3$, $Na_2CO_3$, $TiO_2$, and the like are described as examples of the raw material powders, other Ba compounds, Na compounds, and the like may be used.

After separately preparing the BT calcined powder in which a part of $BaCO_3$ and $TiO_2$ are remained and the BNT calcined powder as described above, the calcined powders are blended in predetermined amounts followed by mixing. The mixing may be either one of wet mixing using a pure water or ethanol or dry mixing, but the dry mixing is preferred since it is possible to more reliably prevent the compositional shift by the dry mixing. Depending on grain sizes of the calcined powders, crushing may be performed after the mixing or simultaneously with the mixing. A central grain diameter of the mixed calcined powder after the mixing and crushing may preferably be 0.5 μm to 2.5 μm.

In the case where 3.0 mol % or less of Si oxide and 4.0 Mol % or less of Ca oxide or Ca carbonate are added in the step of preparing the BT calcined powder and/or the step of preparing the BNT calcined powder, or the step of mixing the calcined powders, the Si oxide favorably suppresses abnormal growth of crystal grains and enables easy control of resistivity, and the Ca oxide or the Ca carbonate favorably improves a sintering property at a low temperature and enables control of reducibility. When either one of them is added in amounts exceeding the above-specified upper limits, the composition undesirably fails to exhibit a semiconductor forming property. The addition may preferably be performed before the mixing in each of the steps.

The mixed calcined powder obtained by the step of mixing the BT calcined powder and the BNT calcined powder is formed by a desired forming means. The crushed powder may be optionally granulated by using a granulator before the forming. A compact density after the forming may preferably be 2.5 to 3.5 g/cm$^3$.

It is possible to perform the sintering in an atmosphere, a reducing atmosphere, or an inert gas atmosphere having a low oxygen concentration, and it is preferable to perform the sintering in a nitrogen or argon atmosphere having an oxygen concentration of less than 1%. The sintering temperature may preferably be 1250° C. to 1350° C. The sintering time may preferably be 2 to 6 hours. In any case, the jump characteristic is undesirably deteriorated due to an increase in the room temperature resistivity along with deviation from the preferred conditions.

Another example of the sintering step is such that, at a temperature of 1290° C. to 1350° C. and in an atmosphere of less than 1% of an oxygen concentration, (1) sintering is performed in a sintering time of less than 4 hours or (2) sintering is performed in a sintering time satisfying an expression: $\Delta T \geq 25\,t$ (wherein t is sintering time (hr), and $\Delta T$ is cooling rate (° C./hr) after sintering), followed by cooling after sintering at a cooling rate satisfying the above expression. According to these sintering steps, it is possible to obtain a semiconductor ceramic composition that is improved in temperature coefficient of resistivity at a high temperature region (higher than the Curie temperature) while maintaining low room temperature resistivity.

EXAMPLES

Example 1

Raw material powders of $BaCO_3$, $TiO_2$, and $La_2O_3$ were so blended as to satisfy $(Ba_{0.994}La_{0.006})TiO_3$, followed by mixing with a pure water. The thus-obtained mixed raw material powder was calcined at 500° C. to 1300° C. for 4 hours in the atmosphere to prepare $(BaLa)TiO_3$ calcined powders. Shown in FIG. 1 are X-ray diffraction patterns of the thus-obtained $(BaLa)TiO_3$ calcined powders at each of calcination temperatures from 500° C. to 1200° C. Note that the lowermost X-ray diffraction pattern is for the case of 500° C. temperature indication though any temperature indication is not given thereto.

Raw material powders of $Na_2CO_3$, $Bi_2O_3$, and $TiO_2$ were so blended as to satisfy $(Bi_{0.5}Na_{0.5})TiO_3$, followed by mixing in ethanol. The thus-obtained mixed raw material powder was calcined at 800° C. for 2 hours in the atmosphere to obtain a $(BiNa)TiO_3$ calcined powder.

Each of the (BaLa)TiO$_3$ calcined powders and the (BiNa)TiO$_3$ calcined powder prepared as described above were blended at a molar ratio of 73/7, followed by mixing and crushing in a pot mill by using a pure water as a medium until an average grain diameter of the mixed calcined powder becomes 1.0 to 2.0 μm, and then the mixed calcined powder was dried. PVA was added to the crushed powder of the mixed calcined powder, followed by mixing, and the mixture was then granulated by using a granulator. The thus-obtained granulated powder was formed by using a uniaxial pressing machine, and a binder was removed from the compact at 700° C., followed by sintering in the atmosphere at a sintering temperature of 1290° C., 1320° C. and 1350° C. for 4 hours, thereby obtaining sintered materials.

Each of test pieces were obtained by processing each of the thus-obtained sintered materials into a plate having the size of 10 mm×10 mm×1 mm, and after a formation of an ohmic electrode, a temperature change of a resistivity value from a room temperature to 270° C. of each of the test pieces was measured by using a resistivity meter. The measurement results are shown in Table 1. The sample number with * means that the sample is a comparative example. The sample number 28 was obtained by a calcination time of 1 hour; the sample number 29 was obtained by a calcination time of 2 hours; and the sample number 30 was obtained by a calcination time of 6 hours. In all of Examples, a temperature coefficient of resistivity was obtained by the following expression: $\alpha=(\ln R_1 - \ln R_c)\times 100/(T_1 - T_c)$, wherein $R_1$ is maximum resistivity, $R_c$ is resistivity at $T_c$, $T_1$ is a temperature indicating $R_1$, and $T_c$ is the Curie temperature.

As is apparent from FIG. 1, in the (BaLa)TiO$_3$ calcined powders calcined at 500° C. to 900° C., (BaLa)TiO$_3$ is not perfectly formed with remaining a part of BaCO$_3$ and TiO$_3$. In contrast, in the (BaLa)TiO$_3$ calcined powders calcined at 1000° C. to 1200° C., BaCO$_3$ and TiO$_3$ are not remained, and a perfect single phase of (BaLa)TiO$_3$ is formed.

Also, as is apparent from the measurement results of Table 1, each of the semiconductor ceramic compositions obtained by using the (BaLa)TiO$_3$ calcined powders each calcined at the calcination temperature of 500° C. to 900° C. in which a part of BaCO$_3$ and TiO$_2$ are remained achieves a higher jump characteristic and a suppressed increase in room temperature resistivity as compared to the semiconductor ceramic compositions obtained by using the calcined powders each calcined at the calcination temperature of 1000° C. to 1300° C. in which the perfect single phase of is formed.

Example 2

Sintered materials were obtained in the same manner as in the sample number 13 of Example 1 except for adding SiO$_2$ and CaCO$_3$ in the amounts shown in Table 2 when blending the (BaLa)TiO$_3$ calcined powder and the (BiNa)TiO$_3$ calcined powder at the molar ratio of 73/7. A measurement of a temperature change of a resistivity value in each of the thus-obtained sintered materials was performed in the same manner as in Example 1. The measurement results are shown in Table 2. As is apparent from Table 2, by the addition of the Si oxide and the Ca carbonate or the Ca oxide during the steps, a high jump characteristic is achieved, and an increase in room temperature resistivity is suppressed as in Example 1.

Example 3

Raw material powders of BaCO$_3$ and TiO$_2$ used as main ingredients and Nb$_2$O$_5$ as a semiconductive dopant were blended so as to satisfy Ba(Ti$_{0.998}$Nb$_{0.002}$)O$_3$, followed by mixing with a pure water. The thus-obtained mixed raw material powder was calcined in the atmosphere at 700° C. to 900° C. for 4 hours to prepare Ba(TiNb)O$_3$ calcined powders. In the thus-obtained Ba(TiNb)O$_3$ calcined powders, Ba(TiNb)O$_3$ was not perfectly formed, and BaCO$_3$ and TiO$_2$ were remained therein.

Raw material powders of NaCO$_3$, Bi$_2$O$_3$, and TiO$_2$ were blended so as to satisfy (Bi$_{0.5}$Na$_{0.5}$)TiO$_3$, followed by mixing in ethanol. The thus-obtained mixed raw material powder was calcined at 800° C. for 2 hours in the atmosphere to prepare (BiNa)TiO$_3$ calcined powders.

Sintered materials were obtained in the same manner as in Example 1 by blending each of the Ba(TiNb)O$_3$ calcined powders and the (BiNa)TiO$_3$ calcined powder prepared as described above at a molar ratio of 73/7. A measurement of a temperature change of a resistivity value in each of the thus-obtained sintered materials was performed in the same manner as in Example 1. The measurement results are shown in Table 3.

As is apparent from the measurement results of Table 3, in the semiconductor ceramic composition represented by [(BiNa)$_x$Ba$_{1-x}$][Ti$_{1-z}$M$_z$]O$_3$ according to the invention, which is obtained by calcining at the calcination temperature of 700° C. to 900° C. and using the Ba(TiNb)O$_3$ calcined powder in which a part of BaCO$_3$ and TiO$_2$ were remained therein, a high jump characteristic is achieved, and an increase in room temperature resistivity is suppressed as in the composition represented by [(BiNa)$_x$(Ba$_{1-y}$R$_y$)$_{1-x}$]TiO$_3$ of Example 1.

TABLE 1

| Sample Number | (BaLa)TiO$_3$ Calcination Temperature (° C.) | Sintering Temperature (° C.) | ρ25 (Ωcm) | Tc (° C.) | Temperature Coefficient of Resistivity (%/° C.) |
|---|---|---|---|---|---|
| 1 | 500 | 1290 | 944.4 | 141.8 | 18.0 |
| 2 | 600 | | 860.8 | 145.9 | 24.5 |
| 3 | 700 | | 822.1 | 148.6 | 19.2 |
| 4 | 800 | | 806.5 | 158.1 | 16.6 |
| 5 | 900 | | 232.2 | 133.7 | 25.5 |
| 6* | 1000 | | 110.4 | 104.3 | 18.6 |
| 7* | 1100 | | 50.1 | 138.9 | 13.0 |
| 8* | 1200 | | 38.1 | 201.4 | 6.6 |
| 9* | 1300 | | 102.5 | 144.1 | 16.8 |
| 10 | 500 | 1320 | 68.6 | 167.8 | 23.5 |
| 11 | 600 | | 65.8 | 163.0 | 20.9 |
| 12 | 700 | | 70.2 | 163.1 | 21.4 |
| 13 | 800 | | 83.1 | 157.9 | 25.0 |
| 14 | 900 | | 44.5 | 167.8 | 17.6 |
| 15* | 1000 | | 38.3 | 172.7 | 10.6 |

TABLE 1-continued

| Sample Number | (BaLa)TiO$_3$ Calcination Temperature (° C.) | Sintering Temperature (° C.) | ρ25 (Ωcm) | Tc (° C.) | Temperature Coefficient of Resistivity (%/° C.) |
|---|---|---|---|---|---|
| 16* | 1100 | | 43.7 | 172.7 | 12.7 |
| 17* | 1200 | | 45.1 | 163.3 | 11.5 |
| 18* | 1300 | | 52.8 | 153.2 | 19.2 |
| 19 | 500 | 1350 | 80.2 | 159.2 | 24.7 |
| 20 | 600 | | 77.2 | 160.5 | 25.0 |
| 21 | 700 | | 73.2 | 157.8 | 24.0 |
| 22 | 800 | | 101.8 | 153.4 | 24.2 |
| 23 | 900 | | 58.7 | 153.5 | 24.5 |
| 24* | 1000 | | 54.0 | 158.6 | 15.9 |
| 25* | 1100 | | 58.9 | 148.8 | 12.4 |
| 26* | 1200 | | 55.0 | 158.8 | 10.9 |
| 27* | 1300 | | 58.8 | 154.1 | 10.6 |
| 28 | 800 | 1320 | 89.8 | 221.1 | 22.8 |
| 29 | 800 | | 88.6 | 180.9 | 23.3 |
| 30 | 800 | | 76.5 | 130.2 | 24.0 |
| 31 | 400 | 1290 | 1323.3 | 130.3 | 23.8 |
| 32 | 400 | 1320 | 104.2 | 155.8 | 22.1 |
| 33 | 400 | 1350 | 118.3 | 160.4 | 24.0 |

TABLE 2

| Sample Number | (BaNb)TiO$_3$ Calcination Temperature (° C.) | SiO$_2$ Addition Amount (mol %) | CaCO$_3$ Addition Amount (mol %) | Sintering Temperature (° C.) | ρ30 (Ωcm) | Tc (° C.) | Temperature Coefficient of Resistivity (%/° C.) |
|---|---|---|---|---|---|---|---|
| 34 | 800 | 8 | 4 | 1320 | 88.9 | 159.6 | 18.9 |
| 35 | | 4 | 2 | | 90.2 | 160.6 | 20.1 |
| 36 | | 2 | 1 | | 77.9 | 161.1 | 19.9 |

TABLE 3

| Sample Number | (BaNb)TiO$_3$ Calcination Temperature (° C.) | Sintering Temperature (° C.) | ρ25 (Ωcm) | Tc (° C.) | Temperature Coefficient of Resistivity (%/° C.) |
|---|---|---|---|---|---|
| 37 | 700 | 1290 | 174.2 | 151.5 | 18.3 |
| 38 | 800 | | 100.5 | 155.8 | 21.9 |
| 39 | 900 | | 122.2 | 154.9 | 19.1 |
| 40 | 700 | 1320 | 86.1 | 158.7 | 16.0 |
| 41 | 800 | | 82.9 | 156.3 | 22.0 |
| 42 | 900 | | 70.9 | 152.8 | 17.6 |
| 43 | 700 | 1350 | 70.2 | 158.1 | 14.7 |
| 44 | 800 | | 68.0 | 148.8 | 17.1 |
| 45 | 900 | | 62.4 | 149.7 | 16.1 |

While the invention has been described in detail and with reference to specific embodiments thereof, it will be apparent to one skilled in the art that various changes and modifications can be made therein without departing from the spirit and scope thereof.

INDUSTRIAL APPLICABILITY

The semiconductor ceramic composition obtained by the invention is optimum as a material for a PTC thermistor, a PTC heater, a PTC switch, a temperature detector, and the like.

The invention claimed is:

1. A method for producing a semiconductor ceramic composition in which a portion of Ba of BaTiO$_3$ is substituted by Bi—Na, the method comprising steps of:

preparing a BT calcined powder comprising (BaR)TiO$_3$ or Ba(TiM)O$_3$ (wherein each of R and M is a semiconductive dopant), wherein a part of BaCO$_3$ and TiO$_2$ are remained therein;
preparing a BNT calcined powder comprising a (BiNa)TiO$_3$ powder;
preparing a mixed calcined powder by mixing the BT calcined powder and the BNT calcined powder; and
forming and sintering said mixed calcined powder.

2. The method for producing a semiconductor ceramic composition according to claim 1, wherein a calcination temperature is 900° C. or less in the step of preparing the BT calcined powder.

3. The method for producing a semiconductor ceramic composition according to claim 1, wherein a calcination temperature is 700° C. to 950° C. in the step of preparing the BNT calcined powder.

4. The method for producing a semiconductor ceramic composition according to claim 1, wherein, in the BT calcined powder, the content of $BaCO_3$ is 30 mol % or less and the content of $TiO_2$ is 30 mol % or less when a total amount of $(BaR)TiO_3$ or $Ba(TiM)O_3$, $BaCO_3$, and $TiO_2$ is taken as 100 mol %.

5. The method for producing a semiconductor ceramic composition according to claim 1, wherein 3.0 mol % or less of Si oxide and 4.0 mol % or less of Ca carbonate or Ca oxide are added before the calcination in the step of preparing the BT calcined powder or the step of preparing the BNT calcined powder or in both of the steps.

6. The method for producing a semiconductor ceramic composition according to claim 1, wherein 3.0 mol % or less of Si oxide and 4.0 mol % or less of Ca carbonate or Ca oxide are added in the step of preparing the mixed calcined powder by mixing the BT calcined powder and the BNT calcined powder.

7. The method for producing a semiconductor ceramic composition according to claim 1, wherein when the semiconductive dopant R is at least one member of rare earth elements and the $(BaR)TiO_3$ calcined powder is used as the BT calcined powder, the semiconductor ceramic composition is represented by a composition formula of $[(BiNa)_x(Ba_{1-y}R_y)_{1-x}]TiO_3$ in which x and y each satisfy $0<x\leqq0.3$ and $0<y\leqq0.02$.

8. The method for producing a semiconductor ceramic composition according to claim 1, wherein when the semiconductive dopant M is at least one member of Nb and Sb and the $Ba(TiM)O_3$ calcined powder is used as the BT calcined powder, the semiconductor ceramic composition is represented by a composition formula of $[(BiNa)_xBa_{1-x}][Ti_{1-z}M_z]O_3$ in which x and z each satisfy $0<x\leqq0.3$ and $0<z\leqq0.005$.

* * * * *